(12) United States Patent
Wallash et al.

(10) Patent No.: US 6,275,361 B1
(45) Date of Patent: Aug. 14, 2001

(54) PROTECTING A MAGNETORESISTIVE HEAD AGAINST ELECTROSTATIC DISCHARGE

(75) Inventors: Al Wallash, Moragn Hill, CA (US); Ferouh Goceman, Paxton, MA (US)

(73) Assignee: Maxtor Corporation, Longmont, CO (US)

(*) Notice: Subject to any disclaimer, the term of this patent is extended or adjusted under 35 U.S.C. 154(b) by 0 days.

(21) Appl. No.: 09/311,650

(22) Filed: May 13, 1999

(51) Int. Cl.[7] ............................................ G11B 5/39
(52) U.S. Cl. ................................................... 360/323
(58) Field of Search .............................. 360/323

(56) References Cited

U.S. PATENT DOCUMENTS

| | | | |
|---|---|---|---|
| 5,465,186 | 11/1995 | Bajorek et al. | 360/113 |
| 5,491,605 | 2/1996 | Hughbanks et al. | 360/113 |
| 5,638,237 | 6/1997 | Phipps et al. | 360/128 |
| 5,644,454 | 7/1997 | Arya et al. | 360/106 |
| 5,699,212 | 12/1997 | Erpelding et al. | 360/104 |
| 5,710,682 | 1/1998 | Arya et al. | 360/106 |
| 5,812,349 | * 9/1998 | Shouji et al. | 360/110 |
| 5,877,933 | * 3/1999 | Johansen et al. | 361/220 |
| 5,963,415 | * 10/1999 | Johansen | 361/212 |
| 5,991,121 | * 11/1999 | Kanda | 360/104 |
| 6,075,676 | * 6/2000 | Hiraoka et al. | 360/104 |

* cited by examiner

Primary Examiner—William Klimowicz
(74) Attorney, Agent, or Firm—Fish & Richardson P.C.

(57) ABSTRACT

Systems and methods for protecting a MR head against ESD are described. The MR head may be automatically and repeatedly shorted (and consequently disabled) whenever the MR head is not required to be operable (e.g., any time after final installation or during testing). The MR head may be coupled to a support assembly that is configured to connect to an actuator assembly. The support assembly includes a shorting mechanism that automatically shorts the MR head upon disconnection of the support assembly from the actuator assembly, regardless of the orientation of the support assembly, and automatically unshorts the MR head upon connection of the support assembly to the actuator assembly. In particular, the support assembly includes a deformable surface characterized by a relaxed state in which the MR head is shorted and a deformed state the MR head is unshorted, wherein the MR head may be repeatedly shorted and unshorted by repeatedly relaxing and deforming the deformable surface. The deformable surface may carry first and second inputs configured to be coupled electrically to the MR head, wherein the two support assembly inputs are shorted together when the deformable surface is relaxed and are unshorted when the deformable surface is deformed.

19 Claims, 4 Drawing Sheets

PROTECTING A MAGNETORESISTIVE HEAD AGAINST ELECTROSTATIC DISCHARGE

BACKGROUND OF THE INVENTION

The application relates to systems and methods for protecting magnetoresistive (MR) heads from damage caused by electrostatic discharge (ESD).

MR heads (also know as MR recording heads, MR sensors and MR elements) are typically used in magnetic storage drives to read data from and write data to magnetic storage disks. MR heads are characterized by a high sensitivity to damage caused by ESD. ESD typically is not a significant concern after a magnetic storage drive has been finally assembled because the MR head and other drive components are contained within a housing that shields the MR head from sources of ESD. On the other hand, ESD is a significant concern before the magnetic storage drive has been assembled (e.g., during manufacture and testing) because the MR head is exposed to many sources of ESD during this time.

A MR head typically is protected prior to final assembly by shorting the leads of the MR head. The MR head leads, however, must be unshorted during testing and prior to final assembly of the magnetic storage drive. Many MR head shorting techniques have been proposed. For example, shorting leads that must be manually connected to and disconnected from the MR head have been proposed. In another approach, Arya et al. (U.S. Pat. No. 5,644,454) has proposed an ESD protection system that includes a shorting bar that automatically shorts the MR head when a load beam on which the MR head is mounted bends beyond a certain angle.

SUMMARY OF THE INVENTION

The invention relates to a scheme for protecting a MR head against ESD. In accordance with this inventive scheme, the MR head may be automatically and repeatedly shorted (and consequently disabled) whenever the MR head is not required to be operable (e.g., any time after final installation or during testing). The MR head may be coupled to a support assembly that is configured to connect to an actuator assembly In one aspect of the invention, the support assembly comprises a shorting mechanism that automatically shorts the MR head upon disconnection of the support assembly from the actuator assembly, regardless of the orientation of the support assembly, and automatically unshorts the MR head upon connection of the support assembly to the actuator assembly.

In another aspect, the invention features a support assembly that comprises a deformable surface characterized by a relaxed state in which the MR head is shorted and a deformed state the MR head is unshorted, wherein the MR head may be repeatedly shorted and unshorted by repeatedly relaxing and deforming the deformable surface.

In another aspect, the invention features a support assembly that comprises a deformable surface carrying first and second inputs configured to be coupled electrically to the MR head, wherein the two support assembly inputs are shorted together when the deformable surface is relaxed and are unshorted when the deformable surface is deformed.

Embodiments may include one or more of the following features.

The support assembly inputs may be unshorted by longitudinally stretching the deformable surface, by bending the deformable surface, or by deforming a region of the deformable surface in the vicinity of the support assembly inputs (e.g., by deforming a region of the deformable surface located between the support assembly inputs).

The deformable surface preferably is elastically deformable. The deformable surface preferably comprises an electrically insulating material. The deformable surface may comprise an elastically deformable polymeric material (e.g., polyimide). The deformable surface may comprise more than one material layer.

The relaxed state of the deformable surface may be characterized by a closed electrical connection between all of the pads of the MR head and the deformed state of the deformable surface is characterized by an open electrical connection between all of the pads of the MR head.

The deformable surface may carry one or more additional inputs configured to be coupled electrically to the MR head, wherein all of the support assembly inputs are shorted together when the deformable surface is relaxed and are unshorted when the deformable surface is deformed.

Among the advantages of the invention are the following. The invention enables an MR head to be repeatedly and easily shorted and unshorted. This feature enables the MR head to be readily unshorted when the MR head must be operable (e.g., during testing and after final assembly), while automatically shorting, and thereby protecting, the MR head against ESD at other times. The MR head be unshorted and shorted automatically as the head support assembly is loaded into and unloaded from an appropriately configured fixture. The inventive shorting mechanism is incorporated into the head support assembly and therefore provides compact, cost-effective ESD protection in a way that is relatively easy to implement in an automated assembly process. The shorting mechanism may be built into the head support assembly at the time the support assembly is manufactured. No additional devices are needed to short and unshort the MR head.

Other features and advantages will become apparent from the following description, including the drawings and the claims.

DESCRIPTION OF THE PREFERRED EMBODIMENTS

Figure 1:
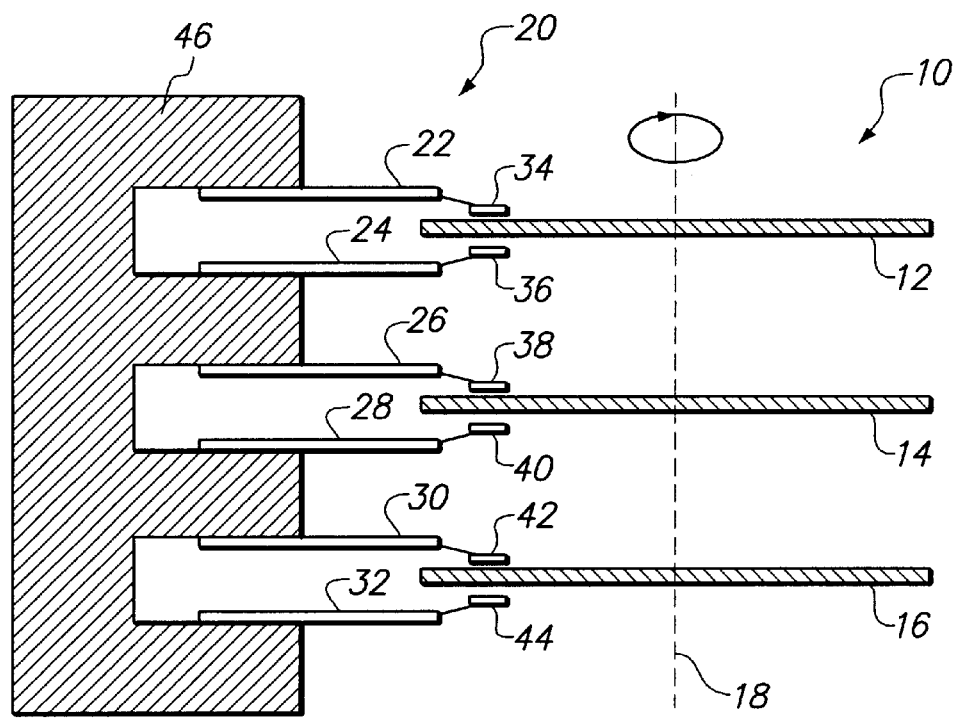
FIG. 1 is a diagrammatic side view of a magnetic storage drive system, including an actuator assembly, a plurality of head support assemblies each coupled to a respective MR head, and a plurality of magnetic storage disks.

Referring to FIG. 1, a magnetic disk storage system 10 includes a plurality of magnetic storage disks 12, 14 and 16, each of which is configured to rotate about an axis 18, and a head stack assembly 20 that includes a plurality of head support assemblies 22, 24, 26, 28, 30 and 32, each of which is coupled by a gimbal mechanism to a respective slider 34, 36, 38, 40, 42 and 44. Each slider 34–44 supports one or more magnetic read/write transducers (MR heads) that may read data from and write data to magnetic storage disks 12–16. Each magnetic storage disk 12–16 stores information in magnetic recording media supported on each disk; the information is stored in an annular pattern of concentric data tracks. As a disk rotates, data stored at different locations on the disk may be accessed by moving a slider to the appropriate locations on the surface of the disk. Slider movement is controlled by an actuator assembly 46 which controls the positions of head support assemblies 22–32. Head support assemblies 22–32 are configured to bias sliders 34–44 against the surfaces of disks 12–16. The rotation of disks 12–16 produces air bearings between sliders 34–44 and the surfaces of disks 12–16; the air bearings lift sliders 34–44 above the surfaces of disks 12–16 by a small, substantially constant distance.

Figure 2:
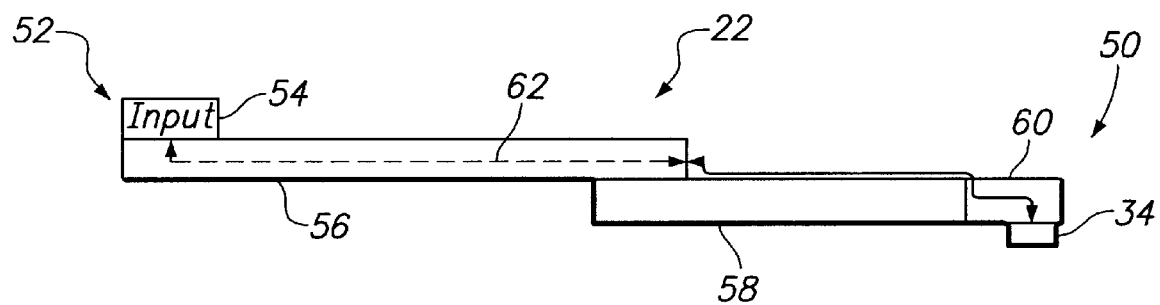
FIG. 2 is a diagrammatic side view of a head support assembly coupled to a MR head.

Referring to FIG. 2, in one embodiment, head support assembly 22 has a front end 50 coupled to a slider 34, and a back end 52 that has an input assembly 54 configured to couple to actuator assembly 46. Head support assembly 22 includes a flexible bump circuit 56 coupled to a base plate 58 which, in turn is coupled to a head gimbal assembly 60 that supports slider 34 and an associated MR head. Read and write signals are communicated to and from the MR head by communication channel 62 that extends from the MR head to input assembly 54.

As described in detail below, the head support assembly includes a mechanism that automatically shorts the MR head upon disconnection of the support assembly from actuator assembly 46 (or other properly configured apparatus), regardless of the orientation of the support assembly, and that automatically unshorts the MR head upon connection of the support assembly from actuator assembly 46 (or other properly configured apparatus). In particular, the head support assembly includes a deformable surface that is characterized by a relaxed state in which the MR head is shorted and a deformed state in which the MR head is unshorted.

Figure 3A:
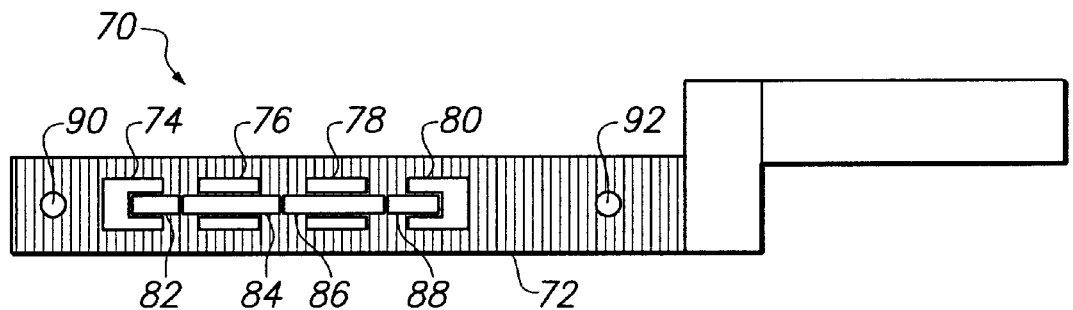
FIGS. 3A and 3B are top and side views, respectively, of a flexible bump circuit with a deformable surface in a relaxed state.
Figure 3B:
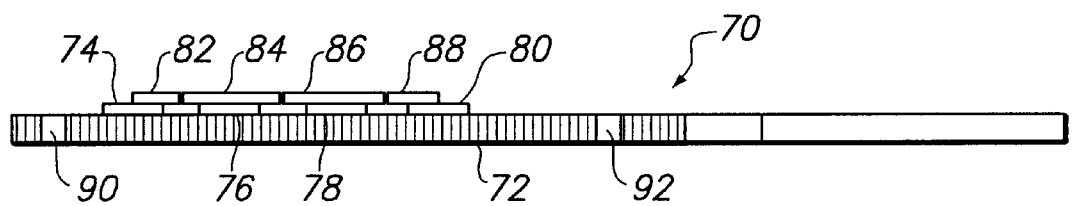
Figure 3C:
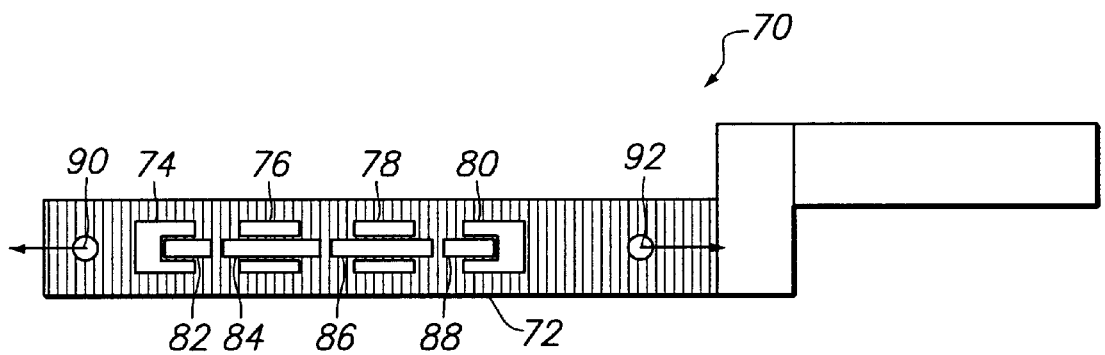
FIGS. 3C and 3D are top and side views, respectively, of the flexible bump circuit of FIGS. 3A and 3B with the deformable surface in a deformed state.
Figure 3D:
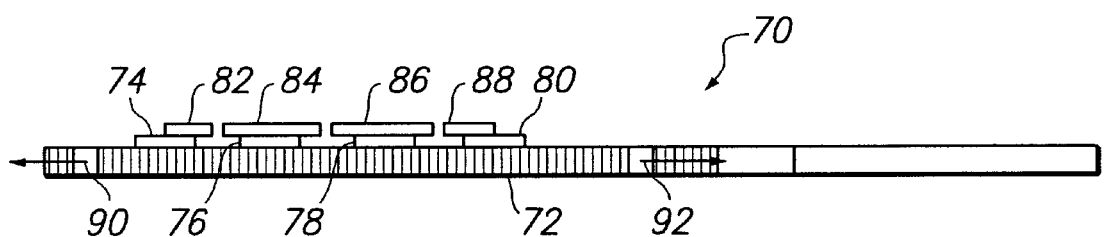

Referring to FIGS. 3A–3D, in one embodiment, a flexible bump circuit 70 includes a deformable surface 72 that supports input pads 74, 76, 78 and 80. Input pads 74, 76 may be coupled by communication channel 62 to the sensing leads of the MR head, and input pads 78, 80 may be coupled by communication channel 62 to the writer leads of the MR head. Input pads 74–80 include respective shorting links 82, 84, 86, 88. When deformable surface 72 is in a relaxed state (FIGS. 3A and 3B), shorting links 82–88 are in electrical contact, thereby shorting together all of the leads of the MR head. When in a deformed state (FIGS. 3C and 3D), shorting links 82–88 are spaced apart, thereby unshorting the MR head leads. Deformable surface 72 includes holes 90, 92 located on opposite sides of input assembly 54. Holes 90, 92 are sized and arranged to receive respective posts of a fixture (which may form part of actuator assembly 46 or part of a testing apparatus). The posts may be longitudinally moved apart until sufficient tension is applied across deformable surface 72 to separate shorting links 82–88, as shown in FIGS. 3C and 3D. Deformable surface 72 is elastically deformable in a longitudinal direction that lies along input pads 74–80, at least within the tension range needed to separate shorting links 82–88, so that deformable surface 72 automatically returns to its relaxed state (FIGS. 3A and 3B) when the tension applied by the fixture is removed.

Figure 4A:
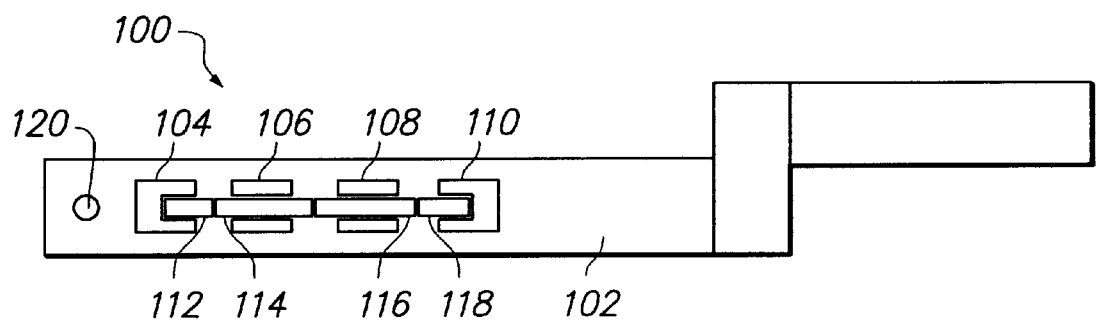
FIGS. 4A and 4B are top and side views, respectively, of a flexible bump circuit with a deformable surface in a relaxed state.
Figure 4B:
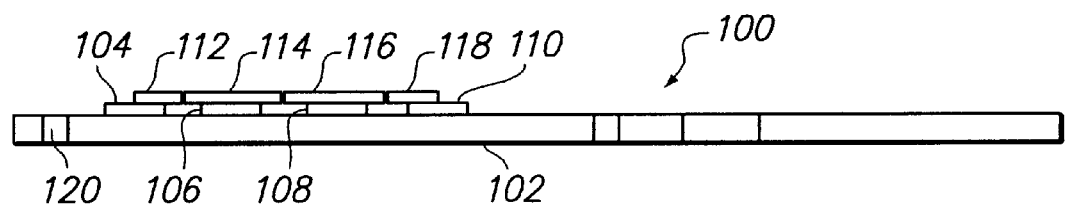
Figure 4C:
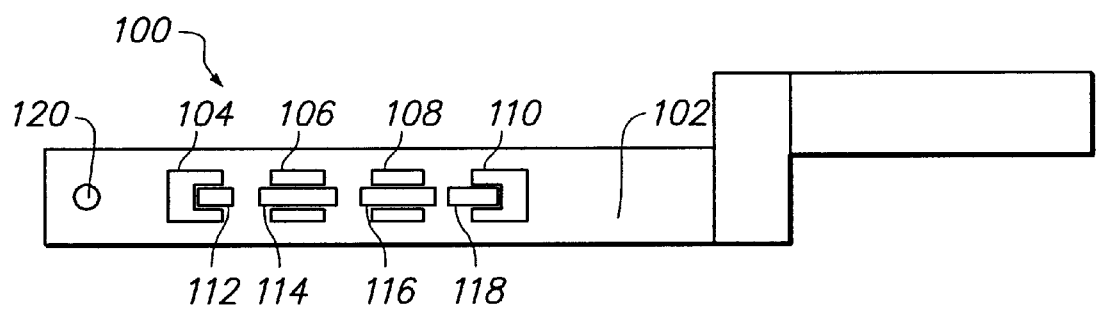
FIGS. 4C and 4D are top and side views, respectively, of the flexible bump circuit of FIGS. 4A and 4B with the deformable surface in a deformed state.
Figure 4D:
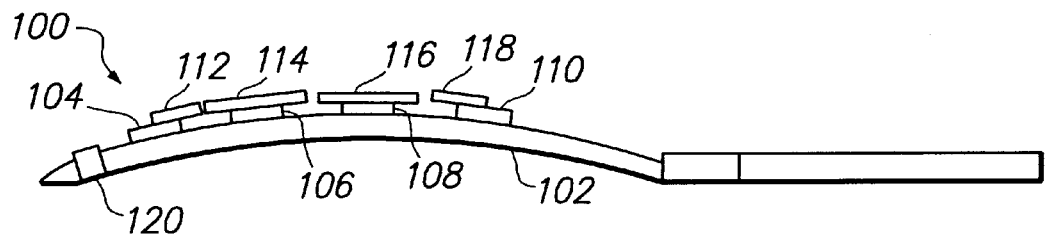

Referring to FIGS. 4A–4D, in another embodiment, a flexible bump circuit 100 includes a deformable surface 102 that supports input pads 104, 106, 108 and 110. Input pads 104, 106 may be coupled by communication channel 62 to the sensing leads of the MR head, and input pads 108, 110 are coupled by communication channel 62 to the writer leads of the MR head. Input pads 104–110 include respective shorting links 112, 114, 116, 118. When deformable surface 102 is in a relaxed state (FIGS. 4A and 4B), shorting links 112–118 are in electrical contact, thereby shorting together all of the leads of the MR head. When in a deformed state (FIGS. 4C and 4D), shorting links 112–118 are spaced apart, thereby unshorting the MR head leads. Shorting links 112–118 preferably have inherent tension that biases shorting links 112–118 together when deformable surface 102 is in a relaxed state. Deformable surface 102 includes a hole 120 located at the back end of deformable surface 102. Hole 120 is sized and arranged to receive a post of a fixture (which may form part of actuator assembly 46 or part of a testing apparatus) that supports the back end of deformable surface 102. To unshort the MR head, the fixture applies a compressive force to the front end of deformable surface 102, causing deformable surface to bend, thereby separating shorting links 112–118, as shown in FIGS. 4C and 4D. Deformable surface 102 is elastically deformable in a plane orthogonal to deformable surface and parallel to a longitudinal direction that lies along input pads 104–110, at least within the compressive force range needed to separate shorting links 112–118, so that deformable surface 102 automatically returns to its relaxed state Rigs. 4A and 4B) when the compressive force applied by the fixture is removed.

Figure 5A:
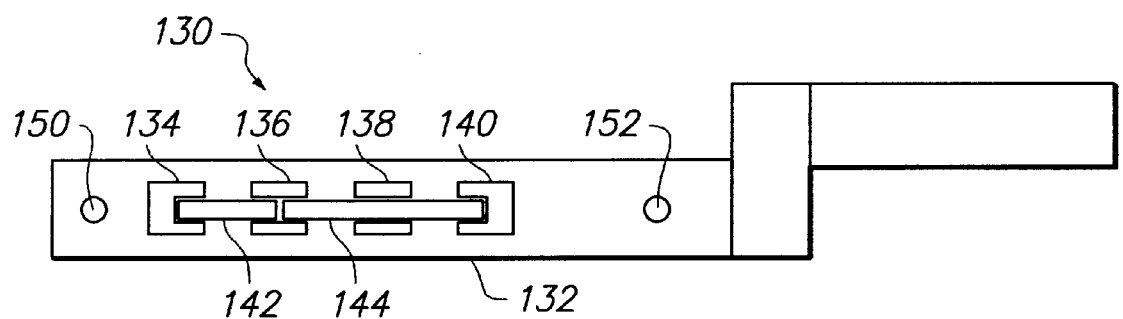
FIGS. 5A and 5B are top and side views, respectively, of a flexible bump circuit with a deformable surface in a relaxed state.
Figure 5B:
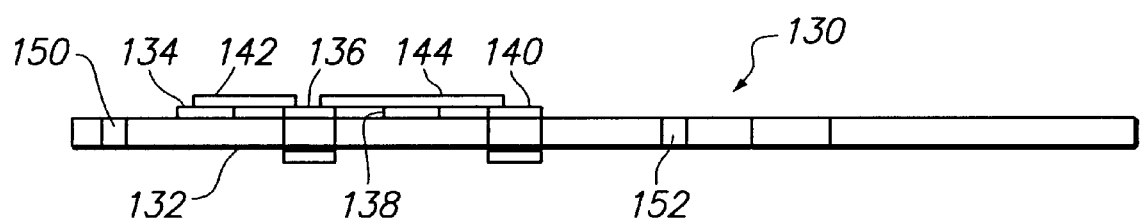
Figure 5C:
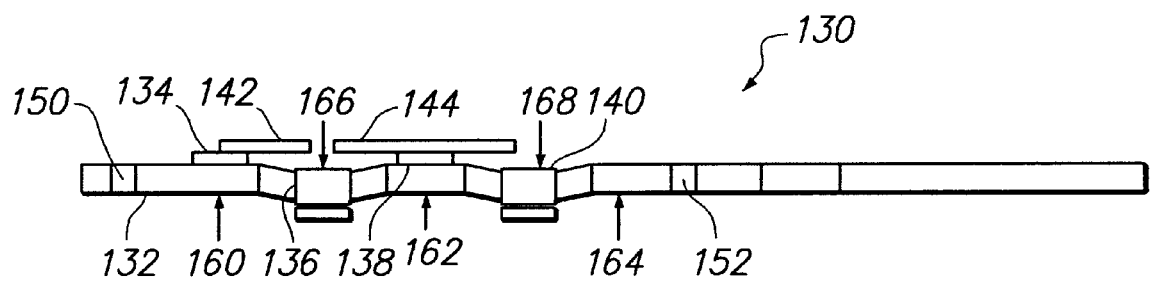
FIGS. 5C is a side view of the flexible bump circuit of FIGS. 5A and 5B with the deformable surface in a deformed state.

Referring to FIGS. 5A–5C, in another embodiment, a flexible bump circuit 130 includes a deformable surface 132 that supports input pads 134, 136, 138 and 140. Input pads 134, 136 may be coupled by communication channel 62 to the sensing leads of the MR head, and input pads 138, 140 may be coupled by communication channel 62 to the writer leads of the MR head. Input pads 136, 140 include respective shorting links 142, 144. When deformable surface 132 is in a relaxed state (FIGS. 5A and 5B), shorting links 142, 144 are in electrical contact with each of input pads 134–140, thereby shorting together all of the leads of the MR head. When in a deformed state (FIG. 5C), shorting links 142, 144 are disconnected from input pads 136, 140, thereby unshorting the MR head leads. Deformable surface 132 includes holes 150, 152 located on opposite sides of input assembly 54. Holes 150, 152 are sized and arranged to receive respective support posts of a fixture (which may form part of actuator assembly 46 or part of a testing apparatus). The fixture is configured to support regions 160, 162, 164 that surround input pads 136, 140, and includes recesses for receiving input pads 136, 140. To unshort the MR head leads, the fixture may apply a downward force 166, 168 on input pads 136, 140 that is sufficient to separate shorting links 142, 144 from input pads 136, 140. Downward force 166, 168 may be applied as flexible bump circuit 130 is being loaded into, e.g., a test fixture. Deformable surface 132 is elastically deformable in a direction that is normal to the surface, at least within the force range needed to separate shorting licks 142, 144 from input pads 136, 140, so that deformable surface 132 automatically returns to its relaxed state (FIGS. 5A and 5B) when the force applied by the fixture is removed.

In each of the embodiments described above, the deformable surface may be elastically deformed in one or more dimensions. The deformable surface may be formed from a polymeric material, such as polyimide (e.g., a Kapton® polyimide; available from DuPont) or rubber. In the embodiment of FIGS. 4A–4D, the deformable surface may be formed from a material, such as MYLAR® polyester film (available from DuPont), which is not easily deformed in the plane of the surface but may be easily bent in a plane normal to the surface. The deformable surface also may be formed from a multiple material layers. For example, in the embodiment of FIGS. 4A–4D, the deformable surface may be formed from a MYLAR® polyester film joined to a polymeric (e.g., rubber) layer.

Other embodiments are within the scope of the claims. For example, although the invention has been described in the context of a magnetic disk storage system, the invention also is applicable to other magnetic recording systems and, in general, to systems that include a magnetic field sensor.

Also, each of the head support assemblies may be formed from a single component that incorporates a deformable surface, rather than from multiple, separate components (flexible bump circuit 56, base plate 58 and gimbal assembly 60) as described above.

What is claimed is:

1. An apparatus for protecting a magnetoresistive (MR) head against electrostatic discharge, comprising:

a support assembly having a front end configured to couple to the MR head and a back end configured to connect to an actuator assembly, the support assembly comprising input pads configured to couple electrically to the MR head and that include shorting links that are in electrical contact with each other to automatically short the MR head upon disconnection of the support assembly from the actuator assembly and are spaced apart from each other to automatically unshort the MR head upon connection of the support assembly to the actuator assembly.

2. An apparatus for protecting a magnetoresistive (MR) head against electrostatic discharge, comprising:

a support assembly having a front end configured to couple to the MR head and a back end configured to connect to an actuator assembly, the support assembly comprising a deformable surface carrying inputs configured to be coupled electrically to the MR head, wherein the support assembly inputs are shorted together by being positioned in electrical contact with each other when the deformable surface is relaxed and are unshorted by being spaced apart for an open electrical connection between such inputs when the deformable surface is deformed.

3. The apparatus of claim 2, wherein the support assembly inputs are unshorted by bending the deformable surface.

4. The apparatus of claim 2, wherein the support assembly inputs are unshorted by deforming a region of the deformable surface in the vicinity of the support assembly inputs.

5. The apparatus of claim 2, wherein the deformable surface is elastically deformable.

6. The apparatus of claim 2, wherein the deformable surface comprises an electrically insulating material.

7. The apparatus of claim 2, wherein the deformable surface comprises an elastically deformable polymeric material.

8. The apparatus of claim 2, wherein the deformable surface comprises polyimide.

9. The apparatus of claim 2, wherein the deformable surface comprises more than one material layer.

10. An apparatus for protecting a magnetoresistive (MR) head against electrostatic discharge, comprising:

a support assembly having a front end configured to couple to the MR head and a back end configured to connect to an actuator assembly, the support assembly comprising a deformable surface carrying first and second inputs configured to be coupled electrically to the MR head, wherein the support assembly inputs are shorted together when the deformable surface is relaxed and are unshorted when the deformable surface is deformed by longitudinally stretching the deformable surface.

11. An apparatus for protecting a magnetoresistive (MR) head against electrostatic discharge, comprising:

a support assembly having a front end configured to couple to the MR head and a back end configured to connect to an actuator assembly, the support assembly comprising a deformable surface carrying first and second inputs configured to be coupled electrically to the MR head, wherein the support assembly inputs are shorted together when the deformable surface is relaxed and are unshorted when the deformable surface is deformed by deforming a region of the deformable surface located between the support assembly inputs.

12. An apparatus for protecting a magnetoresistive (MR) head against electrostatic discharge, comprising:

a support assembly having a front end configured to couple to the MR head and a back end configured to couple to an actuator assembles the support assembly comprising a deformable surface carrying input pads configured to couple electrically to the MR head, the deformable surface being characterized be a relaxed state in which the MR head is shorted and a deformed state in which the MR head is unshorted, wherein the MR head may be repeatedly shorted and unshorted by repeatedly relaxing and deforming the deformable surface; and wherein the relaxed state of the deformable surface is characterized by a closed electrical connection between all of the input pads and the deformed state of the deformable surface is characterized by an open electrical connection between all of the input pads.

13. An apparatus for protecting a magnetoresistive (MR) head against electrostatic discharge, comprising:

a support assembly having a front end configured to couple to the MR head and a back end configured to connect to an actuator assembly the support assembly comprising a deformable surface carrying first and second inputs configured to be coupled electrically to the MR head, wherein the support assembly inputs are shorted together when the deformable surface is relaxed and are unshorted when the deformable surface is deformed; and wherein the deformable surface carries one or more additional inputs configured to be coupled electrically to the MR head, wherein all of the support assembly inputs are shorted together when the deformable surface is relaxed and are unshorted when the deformable surface is deformed.

14. A method for protecting a magnetoresistive (MR) head against electrostatic discharge, comprising:

providing a support assembly for coupling to an actuator assembly and the MR head, the support assembly having a deformable surface that carries inputs configured to be coupled electrically to the MR head, the deformable surface being in a relaxed state to cause the inputs to be shorted together by being positioned in electrical contact with each other; and unshorting the the inputs by deforming the deformable surface of the support assembly to cause the inputs to be spaced apart for an open electrical connection between such inputs.

15. The method of claim 14, wherein the support assembly inputs are unshorted by longitudinally stretching the deformable surface of the support assembly.

16. The method of claim 14, wherein the support assembly inputs are unshorted by bending the deformable surface of the support assembly.

17. The method of claim 14, wherein the support assembly inputs are unshorted by deforming a region of the deformable surface in the vicinity of one or more inputs of the support assembly.

18. The method of claim 14, wherein the MR head is unshorted by elastically deforming the deformable surface of the support assembly.

19. A method for protecting a magnetoresistive (MR) head against electrostatic discharge, comprising:

unshorting the MR head by deforming a deformable surface of a support assembly having a front end configured to couple to the MR head and a back end configured to couple to an actuator assembly, wherein the deformable surface carries inputs to couple electrically to the MR head and unshorting the MR head comprises unshorting the inputs by deforming a region of the deformable surface located between the support assembly inputs; and shorting the MR head by relaxing the support assembly.

* * * * *

UNITED STATES PATENT AND TRADEMARK OFFICE
CERTIFICATE OF CORRECTION

PATENT NO. : 6,275,361 B1
DATED : August 14, 2001
INVENTOR(S) : Wallash et al.

It is certified that error appears in the above-identified patent and that said Letters Patent is hereby corrected as shown below:

Column 6,
Line 31, replace "assembles" with -- assembly, --.
Line 34, replace "be" with -- by --.
Line 49, after the phrase "actuator assembly", insert -- , --.

Column 7,
Line 5, replace "the the" with -- the --.

Signed and Sealed this

Thirtieth Day of April, 2002

Attest:

JAMES E. ROGAN
Attesting Officer     Director of the United States Patent and Trademark Office